United States Patent [19]

Tracy

[11] 4,115,736

[45] Sep. 19, 1978

[54] PROBE STATION

[75] Inventor: John M. Tracy, Thousand Oaks, Calif.

[73] Assignee: The United States of America as represented by the Secretary of the Air Force, Washington, D.C.

[21] Appl. No.: 776,037

[22] Filed: Mar. 9, 1977

[51] Int. Cl.² ............... G01R 31/02; G01R 31/22
[52] U.S. Cl. ............................ 324/158 F; 324/73 R
[58] Field of Search ............. 324/158 F, 158 P, 73 R

[56] References Cited

U.S. PATENT DOCUMENTS

| 3,710,251 | 1/1973 | Hagge et al. | 324/158 F |
|---|---|---|---|
| 3,761,808 | 9/1973 | Ryan | 324/158 F |
| 3,949,295 | 4/1976 | Moorshead | 324/158 F |

OTHER PUBLICATIONS

Bruder et al., "Test Chamber with Seal and Boot," IBM Tech. Dis. Bull., vol. 17, No. 1, Jun. 1974, pp. 92, 93.

Primary Examiner—Rudolph V. Rolinec
Assistant Examiner—Ernest F. Karlsen
Attorney, Agent, or Firm—Joseph E. Rusz; Jacob N. Erlich

[57] ABSTRACT

A probe station having a cryogenic container preferably situated in a vacuum chamber. Semiconductor devices to be tested are attached to the container of cryogenic liquid. Electrical contact to the devices is made using contact wires which are moved by manipulators lying outside the vacuum chamber. Integrity of the vacuum at the manipulators is assured by using bellows to allow for the movement of the contact wires. Visual placement of the contact wires on the devices to be tested is accomplished with the aid of a microscope external to the vacuum. One end of the vacuum chamber is made of clear plastic to be used as the microscope viewing window. A spring is used external to the vacuum space to counteract the effects of atmospheric pressure on the movable bellows. The semiconductor devices are then tested by the connection of the appropriate test equipment to the electrical contact wires. As a result thereof, semiconductor devices can be reliably and effectively tested under the same pressure and temperature at which they are operable.

8 Claims, 3 Drawing Figures

PROBE STATION

STATEMENT OF GOVERNMENT INTEREST

The invention described herein may be manufactured and used by or for the Government for governmental purposes without the payment of any royalty thereon.

BACKGROUND OF THE INVENTION

This invention relates generally to equipment utilized for the testing of electrical components, and, more particularly to a test station capable of probing the surface of semiconductive devices while the devices are in the actual atmosphere and at the actual temperature at which they are to be used.

The use of probes to electrically assess semiconductor devices is an established practice in semiconductor technology. Probing of devices prior to commiting them to attachment of permanent electrical leads allows one to reject those devices which do not meet certain established specifications. Heretofore, the devices to be tested were generally tested at ambient temperature and in normal atmosphere. In other instances, the testing procedure required that electrical contacts be bonded to the device and that the device be immersed in a cryogenic fluid such as liquid nitrogen, for testing at the temperature of the liquid. Such procedures, generally, produced results which were unsatisfactory.

Since the advent of new semiconductor technologies, it is now extremely important to probe electronic devices in vacuum or reduced pressures and at cryogenic temperatures. Furthermore, testing is now required of integrated arrays of infrared photovoltaic semiconductor detectors, such as those constructed of the alloys of PbSnTe and InAsSb. In these cases, it is necessary to cool the devices to as low as 30° K., although useful measurements can sometimes be made at temperatures as high as 195° K. The situation is further complicated since these new materials, because there are very large arrays of individual detectors on one chip, must often be probed. These arrays may contain from one to several thousand detectors. Therefore, the probes must be capable of moving to each detector. Because of the large number of detectors, it is impractical to connect a wire to each detector for testing as accomplished in the past.

SUMMARY OF THE INVENTION

The instant invention overcomes the problems set forth hereinabove by providing a probe station capable of testing electrical components while they are situated in actual operating atmosphere and temperature.

The probe station of this invention is made up of a vacuum chamber which houses therein a container. The container is filled with any suitable cryogenic liquid. A sample or specimen generally in the form of a semiconductor device to be tested is supported above the container by a specimen platform which is in direct contact with the cryogenic liquid within the container.

The vacuum container provides the atmospheric condition in which electrical components are situated and serves two additional purposes. The absence of gas around the cryogenic container serves to insulate the container and sample and ensure that both remain at cryogenic temperatures. Also, as a result thereof, the sample is not exposed to gases that may condense on the surface of the sample or otherwise affect the results of the measurements performed while using the probe station of this invention.

A pair of contact wires are situated within the vacuum chamber. These contacts make contact with the sample and are moved into and out of contact by a pair of manipulators which are situated external to the vacuum chamber. The manipulators generally are capable of movement in three mutually perpendicular directions. This motion is transferred to the contact wires within the vacuum chamber through sealed stainless steel bellows.

A transparent window seats against a rubber O-ring to make a vacuun seal. A binocular microscope is located just above the window so the sample may be observed through the window. Loading of the sample prior to vacuum pumpdown is carried out by removing the window, placing the sample on the cryogenic container and replacing the window. With the vacuum chamber evacuated, atmospheric pressure holds the window in place. Because atmospheric pressure on the bellows tends to move the manipulators inward, a spring of sufficient force to counteract this effect is provided.

Cryogenic liquids are introduced into the inner container through a fill sort or tube. To ensure that the top of the inner container, and therefore the sample, is maintained at the temperature of the cryogenic liquid, rods are welded to the top of the inner container on the inside of that container and arranged so that the ends of the rods are always in contact with the liquid. The top of the inner container and the rods are high conductivity copper.

With the design of the instant invention, the probe station may be used with liquid nitrogen (77° K.), liquid argon (89° K.), or other higher boiling point liquids.

It is therefore an object of this invention to provide a probe station which is capable of testing electrical components under actual operating temperatures and atmosphere.

It is another object of this invention to provide a probe station which eliminates condensation forming on the sample to be tested and therefore affecting the subsequent test results.

It is still another object of this invention to provide a probe station which permits maximum movement of the electrical probes during the testing procedure.

It is still a further object of this invention to provide a probe station in which the tests may be performed under observation through a microscope.

It is still a further object of this invention to provide a probe station which is economical to produce, reliable in operation and which utilizes conventional, currently available components in the manufacture thereof.

For a better understanding of the present invention together with other and further objects thereof reference is made to the following description taken in conjunction with the accompanying drawing and its scope will be pointed out in the appended claims.

DETAILED DESCRIPTION OF THE PREFERRED EMBODIMENT

Figure 1:
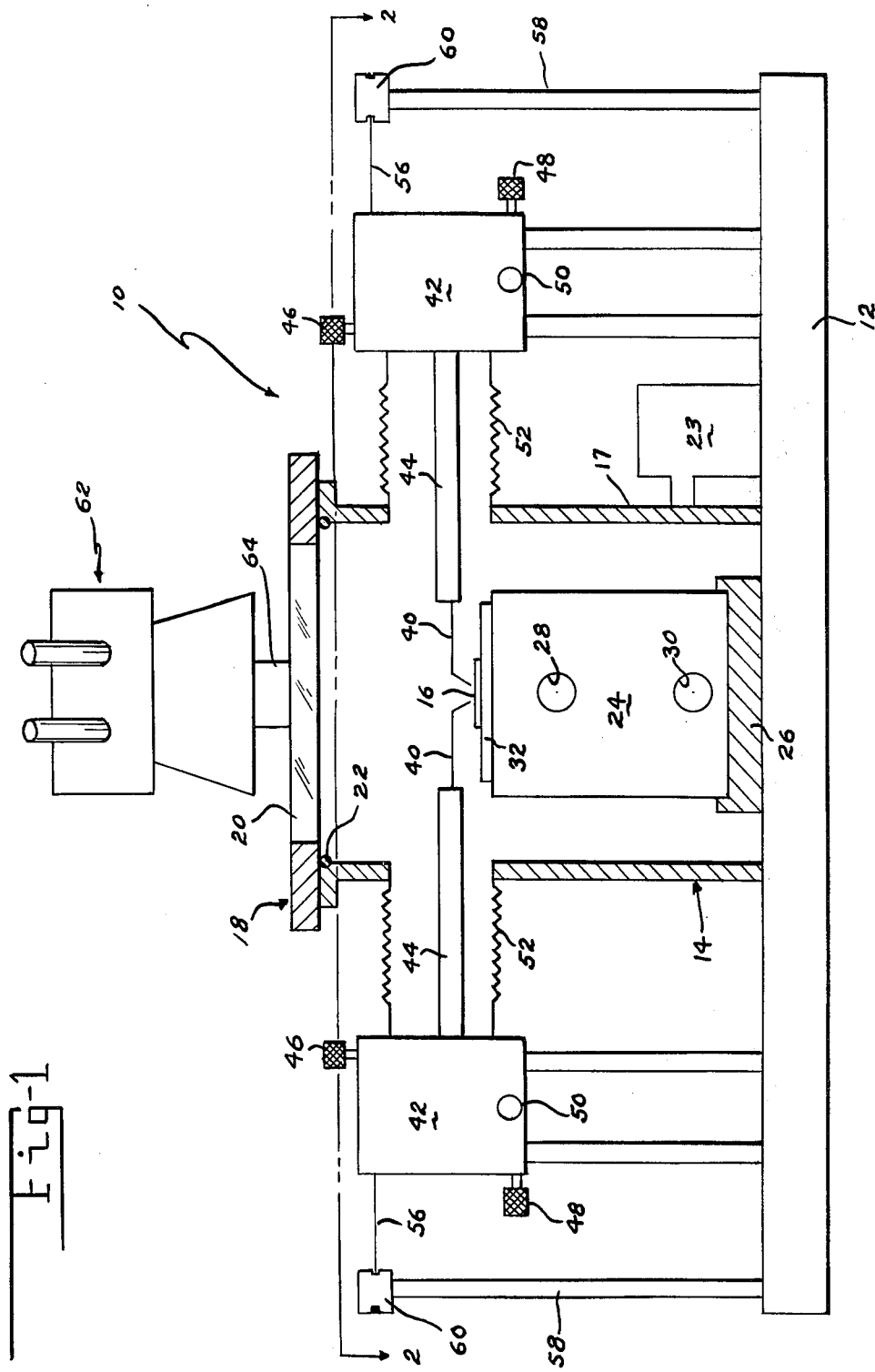
FIG. 1 is a side elevational view, shown in schematic fashion, of the probe station of this invention shown partly in cross-section.
Figure 2:
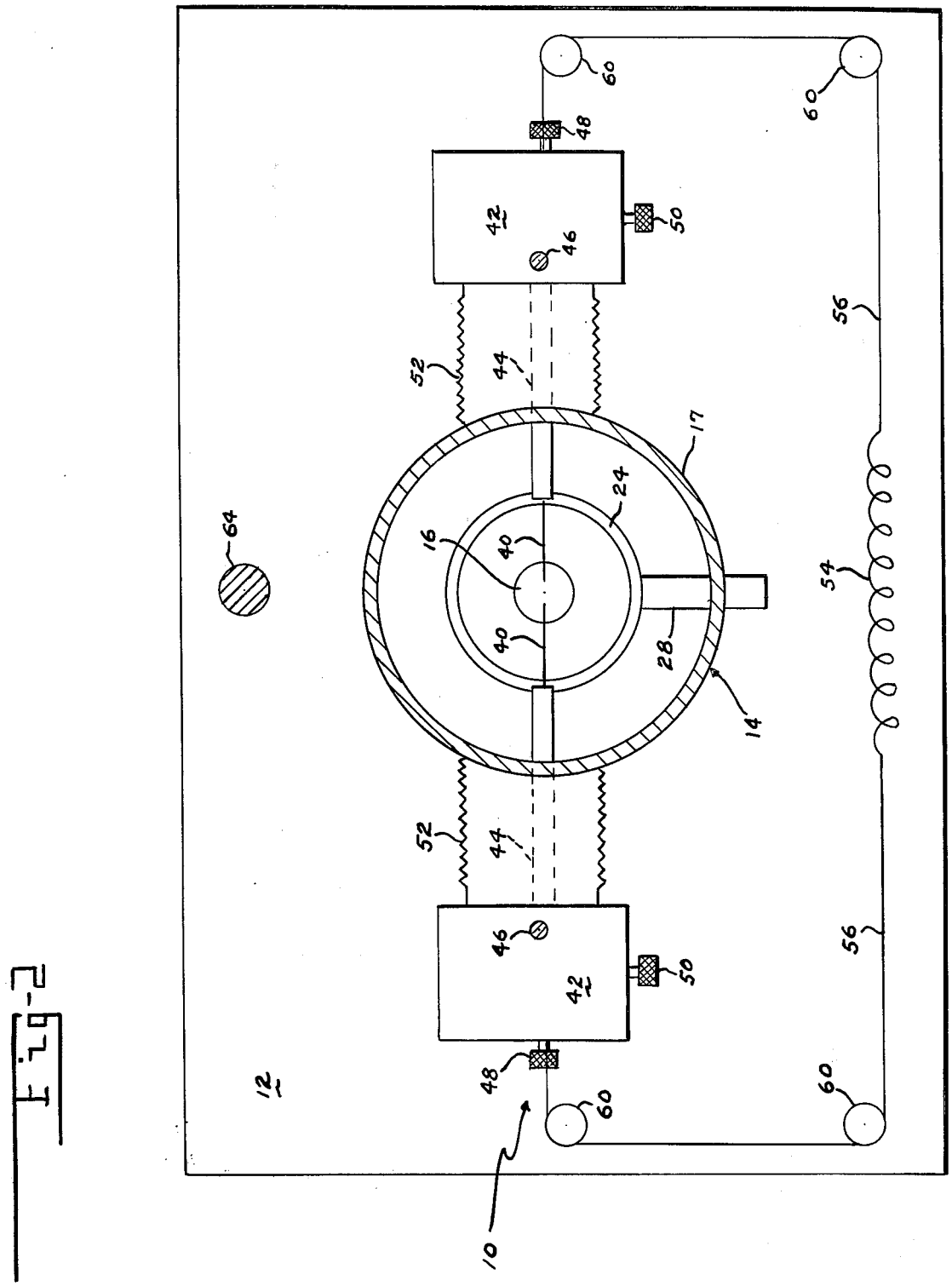
FIG. 2 is a plan view, shown in schematic fashion, of the probe station of this invention taken along line II–II of FIG. 1.

Reference is now made to FIGS. 1 and 2 of the drawing which best illustrate probe station 10 of this invention. Probe station 10 is made up of any suitable mount 12 which supports thereon a chamber 14, the interior of which is at the atmospheric pressure at which an electrical component such as a semiconductor device or test specimen 16 is generally operable. In most instances this environment is a vacuum and therefore chamber 14 takes the form of any conventional vacuum chamber. Chamber 14 is generally made of, although not limited to, a cylindrically configured housing or enclosure 17 having a cover 18. Cover 18 has a transparent window 20, centrally located therein, window 20 being made preferably of plastic or glass. Any suitable seal such as a rubber O-ring 22 is situated between cover 18 and housing 17. A conventional vacuum pump 23 is operatively connected to chamber 14 to evacuate air therefrom.

Figure 3:
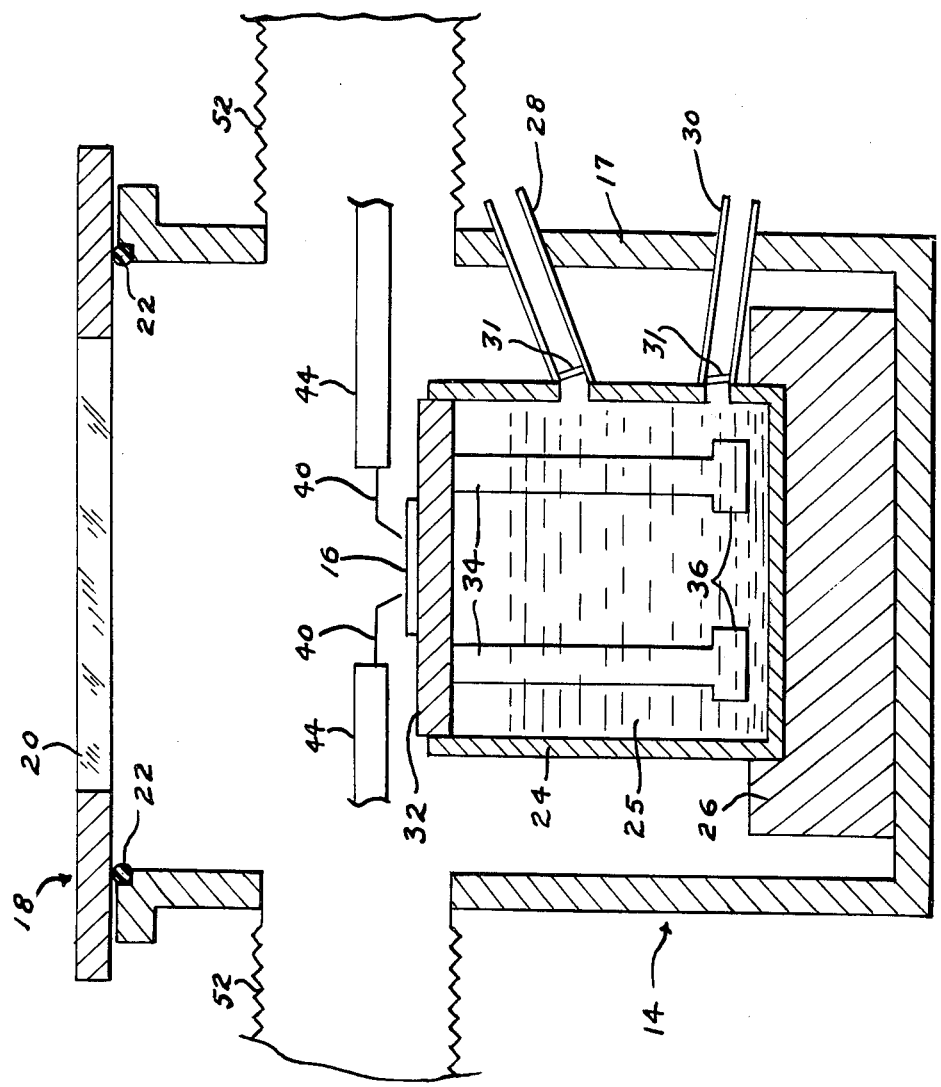
FIG. 3 is an exaggerated side elevational view of the vacuum chamber of the probe station of this invention shown in cross-section.

Located within chamber 14 and as best illustrated in FIG. 3 of the drawing is a container 24. Container 24 is mounted upon a suitable supporting frame 26. In the instant invention, where it is desirable to test specimens 16 at cryogenic temperatures, any suitable cryogenic liquid 25 such as liquid nitrogen (77° K.), liquid argon (89° K.) or other higher boiling point liquid can be introduced into container 24 through an inlet or filler tube 28. Filler tube 28 is attached to container 24 and is secured to housing 17, protruding therethrough. Any suitable securing method such as welding may be utilized to fixedly attach tube 28 to housing 17.

Liquid 25 may be removed from container 24 through an outlet tube 30 which is attached to housing 17 in a manner similar to tube 28. Conventional one way valves 31 are located within tubes 28 and 30 in order to prevent any accidental loss of liquid from container 24.

Situated within and sealing the top portion of container 24 is a top 32 acting as a test platform and made of any suitable high conductive material such as copper. Top 32 protrudes slightly from container 24 and acts as a specimen table. Taps holes (not shown) may be provided in top 32 of container 24 to connect specimen holders and radiation shields. To ensure that top 32 of container 24, and therefore specimen or electrical component 16, is maintained at the temperature of cryogenic liquid 25, rods 34 are secured by any conventional securing method such as welding to top 32 on the inside of container 24. Rods 34 are arranged so that the ends 36 thereof are always in contact with liquid 25. Both top 32 and rods 34 are preferably made of copper.

The appropriate tests are performed by a pair of electrical contact wires 40. Electrical connection to contact wires can be made through insulated vacuum feedthroughs (not shown) in the wall of housing 17. Since the pair of contact wires 40 are operationally identical, a detailed description of only one contact wire 40 and its associated hardware will be set forth hereinbelow.

Movement of contact wire 40 is carried out by a conventional manipulator 42 which is located external of chamber 14. An arm or extension 44 operatively connects wire 40 to manipulator 42 as well as to any associated detection equipment (not shown). Manipulator 42 is able to move in three mutually perpendicular directions by the appropriate movement of adjusting screws 46, 48 and 50.

The subsequent motion of contact wires 44 is transferred into chamber 14 through the use of a pair of stainless steel bellows 52 connected between manipulators 42 and chamber 14. The precise material which makes up contact wires 44 is determined by the nature of the semiconductor conductor specimen 16 to be tested. In addition, a stepping motor or the equivalent may be utilized in conjuction with manipulators 42 so that the entire probing operation can be carried out automatically.

During use with vacuum chamber 14, atmospheric pressure on bellows 52 tends to move manipulators 42 inward, in the direction of chamber 14. To counteract this force a spring 54 of sufficient strength, as shown in FIG. 2 of the drawing, is provided. Spring 54 is attached by means of wire 56 to manipulators 42. A plurality of guide rods 58 attached to mount 12 support wire 56 by means of pulleys 60.

Since specimens 16 as small as 0.004 inch may be probed with the probe station 10 of this invention, the position of contact wires 40 can be observed with the aid of a conventional microscope 62 positioned above transparent window 20 by a support rod 64. A minicomputer (not shown) carries out the required tests on individual elements or specimen arrays as they are probed by contact wires 40.

Loading of the electrical component or test specimen 16 is preformed prior to the evacuation of chamber 14 by vacuum pump 23. This is accomplished by removing cover 18, placing component 16 on top 32 of container 24 and replacing cover 18. Upon the evacuation of chamber 14, atmospheric pressure securely holds cover 18 in place. The cryogenic liquids are introduced into container 24 by means of filler tube 28 as set forth hereinabove.

Furthermore, the probe station 10 of this invention is not limited to the materials discussed hereinabove. It can be used for studies of metal-insulator-semiconductor devices at liquid nitrogen temperatures and to study the effects of reduced pressure of the passivation of exposed p-n junctions. Other applications where probe station 10 would be useful are: Probing of any semiconductor devices where reduced temperatures are required to achieve desired electrical or optical properties (including photo-conductive infrared detector arrays, integrated infrared detector-charge-coupled-device arrays and devices to be used in cooled low noise amplifier circuits, among others); electrical and thermal transport measurements of metals or insulators where the attachment of permanent connections would be impractical or undesirable; and manipulation of cooled biological material in vacuum or controlled atmosphere.

Although this invention has been described with reference to a particular embodiment, it will be understood to those skilled in the art that this invention is capable of a variety of alternate embodiments within the spirit and scope of the appended claims.

I claim:

1. A probe station for the testing of specimens at preselected temperatures and pressures comprising a chamber, means operably connected to said chamber for maintaining said preselected pressure within said chamber, a container located within said chamber, a cryogenic liquid located within said container, said container having a top thereon, said top being in the form of a flat block-like platform and having a plurality of rods attached to the underside thereof, said rods being immersed within said liquid within said container, at least one contact wire in operative relationship with said specimen located on said top and means operatively connected to said contact wire for moving said wire in a plurality of directions.

2. A probe station for the testing of specimens at preselected temperatures and pressures as defined in claim 1 wherein said means for moving said contact wire comprises a manipulator and an arm operably connected thereto, said contact wire being connected to said arm for movement therewith.

3. A probe station for the testing of specimens at preselected temperatures and pressures as defined in claim 2 further comprising means operably associated with said manipulator for counteracting the effect of any external pressures acting thereon.

4. A probe station for the testing of specimens at preselected temperatures and pressures as defined in claim 3 further comprising means encompassing said arm and interconnected between said manipulator and said chamber for preventing said arm and said contact wire from being exposed to pressure other than said preselected pressure.

5. A probe station for the testing of specimens at preselected temperatures and pressures as defined in claim 4 wherein said means interconnected between said manipulator and said chamber is a bellows.

6. A probe station for the testing of specimens at preselected temperatures and pressures comprising a chamber, means operably connected to said chamber for maintaining said preselected pressure within said chamber, a container located within said chamber, said container having a top thereon, means within said container for maintaining said top at said preselected temperature, at least one contact wire in operative relationship with said specimen located on said top, means operatively connected to said contact wire for moving said wire in a plurality of directions, said means for moving said contact wire being in the form of a manipulator and an arm operably connected thereto, said contact wire being connected to said arm for movement therewith, means encompassing said arm and interconnected between said manipulator and said chamber for preventing said arm and said contact wire from being exposed to pressure other than said preselected pressure and means operatively associated with said manipulator for counteracting the effect of any external pressures thereon.

7. A probe station for the testing of specimens at preselected temperatures and pressures as defined in claim 6 wherein said chamber has a transparent window at one end thereof.

8. A probe station for the testing of specimens at preselected temperatures and pressures as defined in claim 7 further comprising means in operative relationship with said transparent window for viewing said specimen and said contact wire.

* * * * *